(12) United States Patent
King et al.

(10) Patent No.: US 7,812,455 B2
(45) Date of Patent: Oct. 12, 2010

(54) INTERCONNECT IN LOW-K INTERLAYER DIELECTRICS

(75) Inventors: Sean King, Beaverton, OR (US); Ruth Brain, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/139,848

(22) Filed: Jun. 16, 2008

(65) Prior Publication Data

US 2009/0309227 A1    Dec. 17, 2009

(51) Int. Cl.
*H01L 23/48* (2006.01)
*H01L 23/52* (2006.01)
*H01L 29/40* (2006.01)

(52) U.S. Cl. ............... 257/774; 257/508; 257/E23.001
(58) Field of Classification Search ................. 438/672, 438/622, 678, 637; 257/508, 774, E29.01, 257/E23.001
See application file for complete search history.

(56) References Cited

U.S. PATENT DOCUMENTS

2004/0110369 A1* 6/2004 Jiang et al. ................. 438/637
2004/0142557 A1* 7/2004 Levy et al. ................. 438/680

* cited by examiner

*Primary Examiner*—Thomas L Dickey
*Assistant Examiner*—Nikolay Yushin
(74) *Attorney, Agent, or Firm*—Laleh Jalali

(57) ABSTRACT

A method for forming deep lithographic interconnects between a first metal and a second metal is provided. The method comprises depositing a first insulator layer on a semiconductor substrate; etching the first insulator layer at a selected location to provide at least a first via to the semiconductor substrate; depositing the first metal on the semiconductor substrate to form at least a first metal contact plug in the first via in contact with the semiconductor substrate; treating the semiconductor substrate with an in-situ plasma of a nitrogen containing gas wherein the plasma forms a nitride layer of the first metal at least capping a top surface of the first metal plug in the first via; and forming a second metal contact to the metal nitride layer capping at least the top surface of the first metal plug.

6 Claims, 5 Drawing Sheets

INTERCONNECT IN LOW-K INTERLAYER DIELECTRICS

BACKGROUND

Developing and implementing low-k ILD based ICs requires complementary and compatible photolithography and etching processes to pattern devices that will not attack underlying layers critical to device performance. For example, tungsten (W) contacts in transistor terminals (e.g., gates), which may be formed as plugs in deep vias by etching through SiO2, etch-stops, low-k ILD and metal hard masks, may be attacked using conventional etches and final resist cleaning processes. In particular, during low-k ILD patterning TiN metal hard masks (HM) removal can occur. In addition, TiN etchants may also attack and etch W.

Via 0 (V0) contacts are contact vias which are used, for example, as vertical interconnects between the source/drain of CMOS devices and the metal lines in multilevel interconnect schemes. The current post patterning cleaning schemes as applied to a first metal layer (M1) deposited on a V0 have an extremely narrow process window due to the requirements of being able to remove both the metal HM (Ti or TiN), photoresist, and residual etch polymer while simultaneously not etching W, Cu or the low-k ILD. The combination of TiN HM with the underlying W is particularly troublesome as the resist cleans used in the patterning process to form several metal layers (e.g., M1, M2, M3 and M4) all attack W.

One current approach to overcoming one aspect of the above problem is the use of Ti HM. Various process are known in the art that utilize resist cleans which are compatible with W, Cu, and low-k ILD and which are also capable of simultaneously removing Ti HM. However, the Ti HM is opaque, making it difficult to register mask alignment with structures formed in previous photolithographic steps. As dimensional scaling continues, maintaining relative dimensional registration accuracy is becoming an increasingly demanding operation.

There is a need, therefore, for a method of fabricating deep W contact vias in low-k ILD ICs which can endure attacks from resist cleans and metal HM removal steps, and which provides transparency to enable improved photolithographic registration.

BRIEF DESCRIPTION OF THE DRAWINGS

Embodiments of the present invention are understood by referring to the figures in the attached drawings, as provided below.

Features, elements, and aspects of the invention that are referenced by the same numerals in different figures represent the same, equivalent, or similar features, elements, or aspects, in accordance with one or more embodiments.

DETAILED DESCRIPTION OF EXEMPLARY EMBODIMENTS

Figure 1:
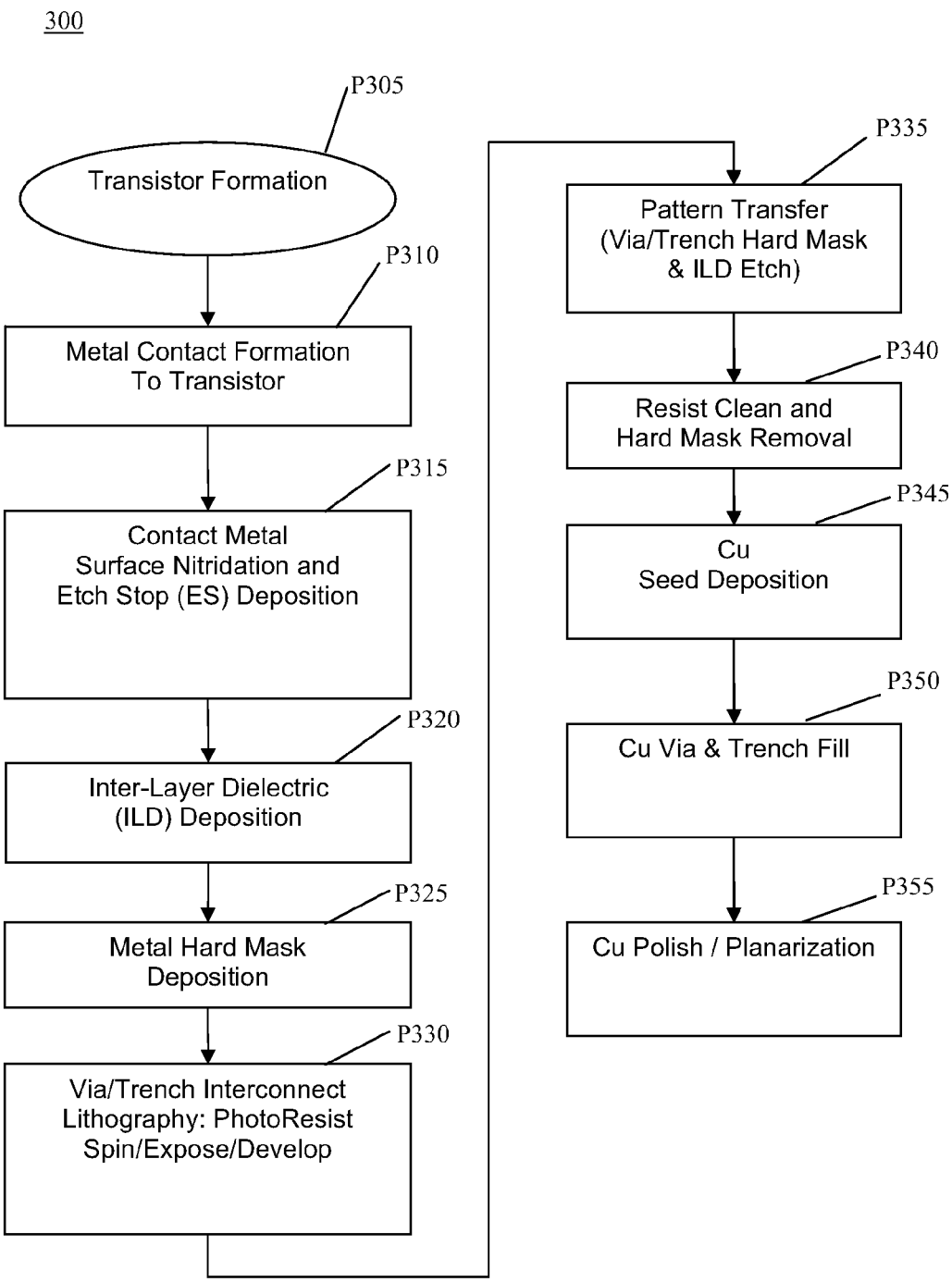
FIG. 1 is a flow diagram illustrating a method of forming Cu to W interconnects in interlayer dielectric structures, according to one embodiment.

Methods are proposed to improve the formation of interconnects through vias in insulators to semiconductors. More particularly, in semiconductor devices including low-k ILD, where interconnects are susceptible to etch damage by resist cleans and etchants for removal of other materials, a method is disclosed for protecting the interconnect from damage.

In accordance with one embodiment, a method for forming deep lithographic interconnects between a first metal and a second metal is provided. The method comprises depositing a first insulator layer on a semiconductor substrate; etching the first insulator layer at a selected location to provide at least a first via to the semiconductor substrate; depositing the first metal on the semiconductor substrate to form at least a first metal contact plug in the first via in contact with the semiconductor substrate; treating the semiconductor substrate with an in-situ plasma of a nitrogen containing gas wherein the plasma forms a nitride layer of the first metal at least capping a top surface of the first metal plug in the first via; and forming a second metal contact to the metal nitride layer capping at least the top surface of the first metal plug.

In the following, one or more embodiments are disclosed by way of example as applicable to Cu—W deep lithographic interconnects in low-k ILD structures. It is noteworthy, however, that in other implementations any suitable metal or refractory metal may be utilized instead of Cu and W, respectively. As such, the scope of the claims and this disclosure shall not be construed as limited to Cu and W as disclosed in the exemplary embodiments herein.

In one exemplary implementation a method of forming Cu—W deep lithographic interconnects in low-k ILD structures comprises depositing a first insulator layer on a semiconductor substrate, wherein the first insulator layer comprises at least one of $SiO_2$ or a low-k ILD; etching the first insulator layer at a selected location to provide at least a first via to the semiconductor substrate; depositing W on the semiconductor substrate to form one or more W plugs in the first via in contact with the semiconductor substrate; treating the semiconductor substrate with an in-situ plasma of at least one of $NH_3$ or $N_2$, wherein the plasma forms a layer of $WN_x$ at least capping a top surface of the W plug in the first via; and forming Cu contacts to the $WN_x$ layer capping the top surface of the W plugs.

A Cu—W deep lithographic interconnect, according to one embodiment comprises a semiconductor substrate; a first insulator layer on the semiconductor substrate, wherein the insulator comprises at least one of $SiO_2$ or a low-k ILD; one or more first vias formed by etching through the first insulator to the semiconductor substrate; a W plug formed in the one or more first vias to contact the substrate; a $WN_x$ layer formed to cap the W plug in the one or more first vias; and an etch-stop layer to protect the first insulator layer, where in the etch-stop layer is selectively etched to expose the $WN_x$ layer cap.

The interconnect may further comprise a second insulator layer over the etch-stop, wherein the second insulator comprises at least one of $SiO_2$ or a low-k ILD, and the second insulator is etched to form a second via to the $WN_x$ layer cap and is further etched to form trenches connecting a plurality of vias so formed; a trench form to a selected depth by further patterning and etching the second insulator layer to a selected depth; a Cu contact formed in the vias and trenches by depositing first a seed layer of Cu, and then a second thicker layer of Cu wherein the second Cu layer fills at least the second vias and the trenches, making contact to the WN, layers capping the W plugs, and wherein excess Cu is removed.

Figure 2:
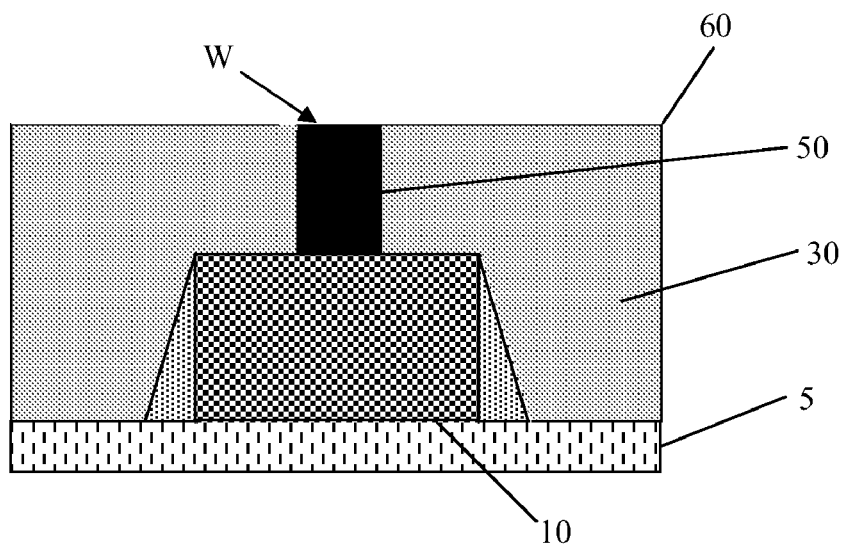
FIGS. 2-9 show various stages of forming Cu to W interconnects in interlayer dielectric structures, according to one embodiment.

Nitrides of W (especially $W_2N$) are stable in aqueous solutions over a wide pH environment. Referring to FIGS. 1 and 2, an exemplary method 300, for forming Cu to W interconnects in interlayer dielectric structures, may begin with formation of a transistor 10 on a substrate 5 (P305). It is noteworthy that for the purpose of brevity, the figures depict an abstract illustration of transistor 10 and thus certain details or components (e.g., source, drain, channel, gate, and associated source/drain/gate electrodes) that are generally known to a person of ordinary skill in the art are not shown in detail.

In one embodiment, an insulator layer 30 (e.g., $SiO_2$) may be deposited to cover the transistor 10. At least one via 50 may be formed in the insulator layer 30. In one embodiment, metal contacts comprising, for example W, may be deposited into via 50 (P310). A chemical-mechanical planarization process may be performed to remove any excess amount of W that may have been deposited, desirably leaving the insulator layer 30 and exposed via 50 filled with W with a planar appearance.

Figure 3:
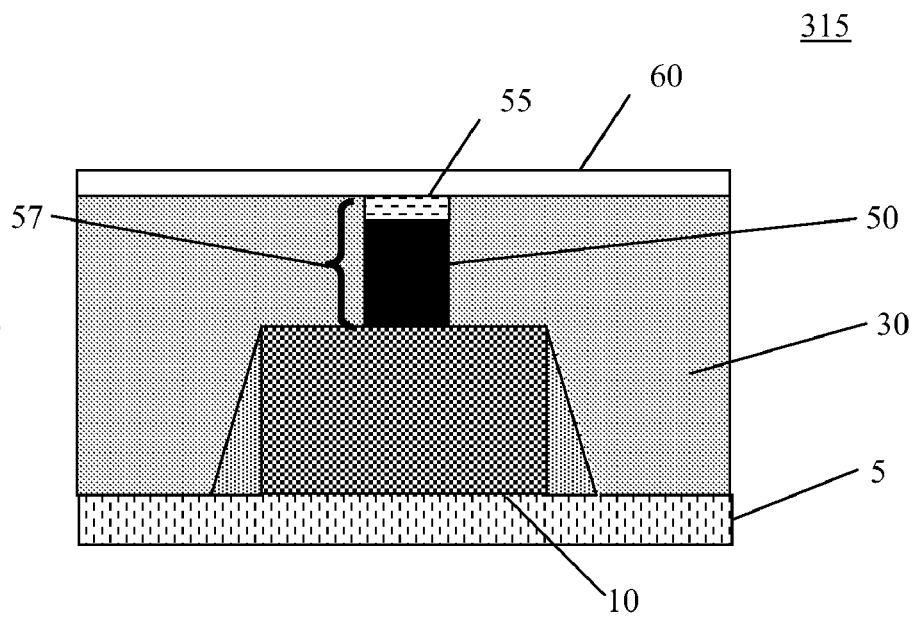

Referring to FIGS. 1 and 3, to improve the quality of Cu—W interconnects, metal nitridation of the W may be accomplished by treating the substrate 5 with an in situ plasma of $NH_3$ or $N_2$ to form a layer $WN_x$ 55 (P315). Via 50 filled with W and $WN_x$ 55 may form a first interconnect part 57. As noted earlier, nitridation of tungsten can provide a stable material phase over a wide pH environment. As such, $WN_x$ layer 55 provides protection of the W plug against the corrosive effects of etchants and resist cleans.

In one embodiment, a protective etch-stop (ES) layer 60 comprising an etch-resistant material may be deposited over insulator layer 30 and $WN_x$ 55 of first interconnect part 57 (P315). ES layer 60 may comprise of one or more of SiN, SiC, SiCN, BN, SiBN and SiBCN deposited by a plasma deposition scheme, for example.

Figure 4:
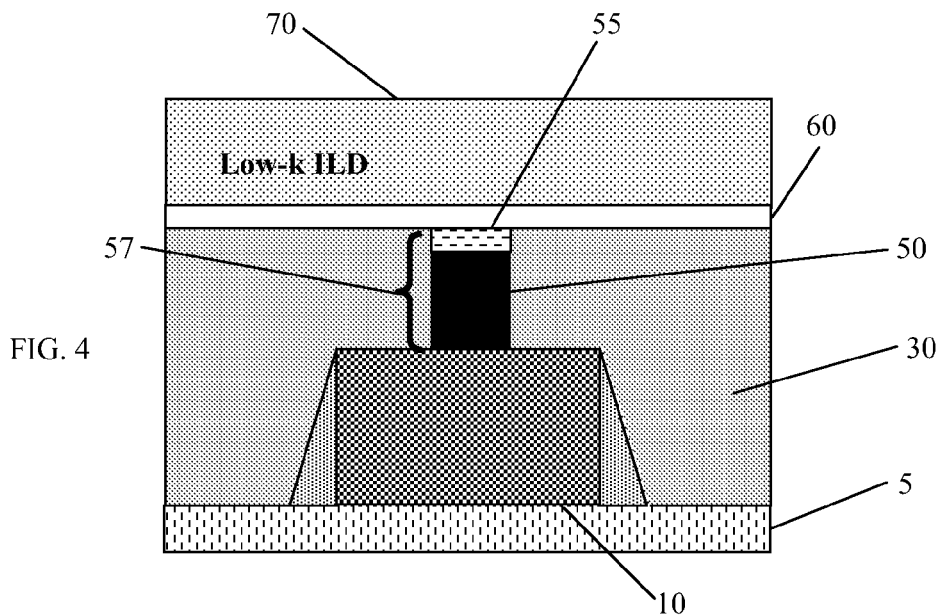
Figure 5:
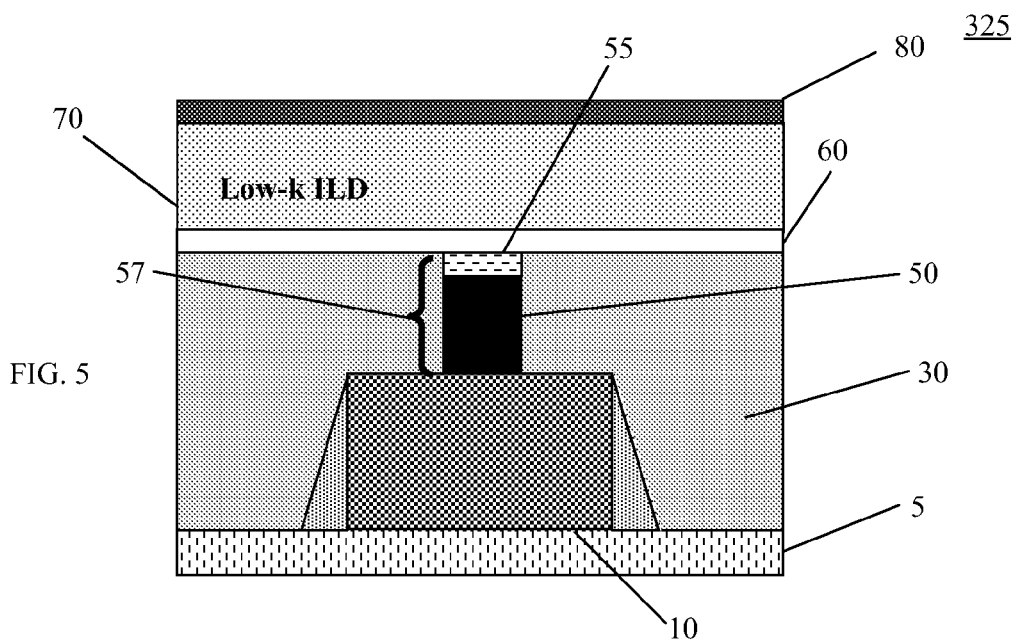

Referring to FIGS. 1, 4 and 5, an ILD 70 may be formed over ES layer 60 (P320). ILD 70 may be a low dielectric constant insulator (low-K ILD), for example. A hard mask (HM) 80 may be formed on the surface of the ILD (P325). HM 80 may be a layer comprising at least one of Ti or TiN, for example. It is noteworthy, however, that other metals or compounds (metallic or otherwise) may be used to form HM 80. In one embodiment, the HM 80 may comprise a layer of Ti, such that the mask is relatively opaque to wavelengths of illuminating light used for mask registration. In alternative embodiment, HM 80 may comprise TiN which is relatively more transparent at such illumination wavelengths. In such embodiments, registration of HM 80 with features, including first interconnect part 57, is facilitated more conveniently.

Figure 6:
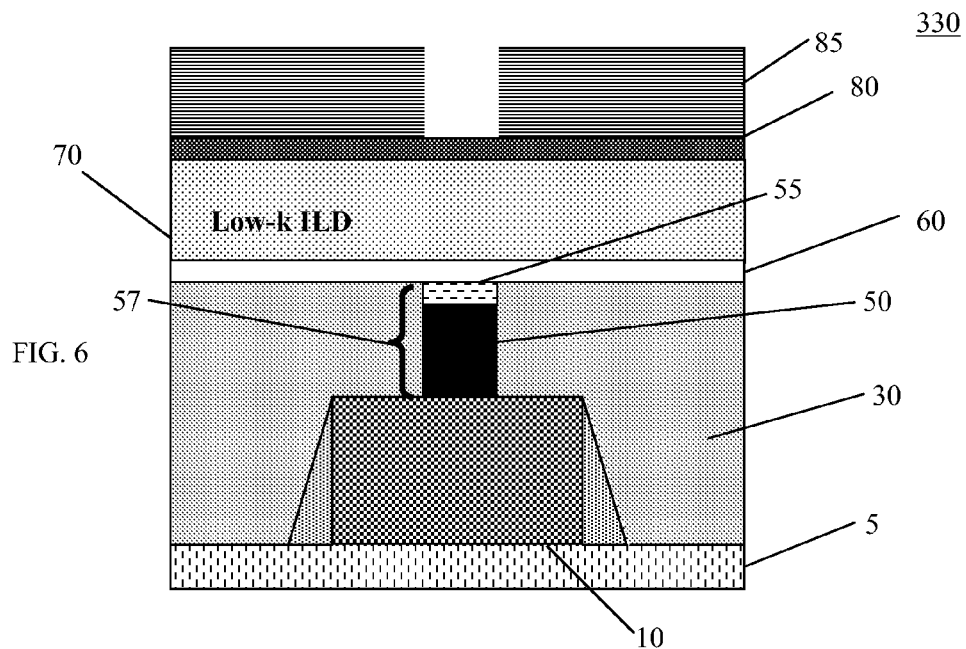
Figure 7:
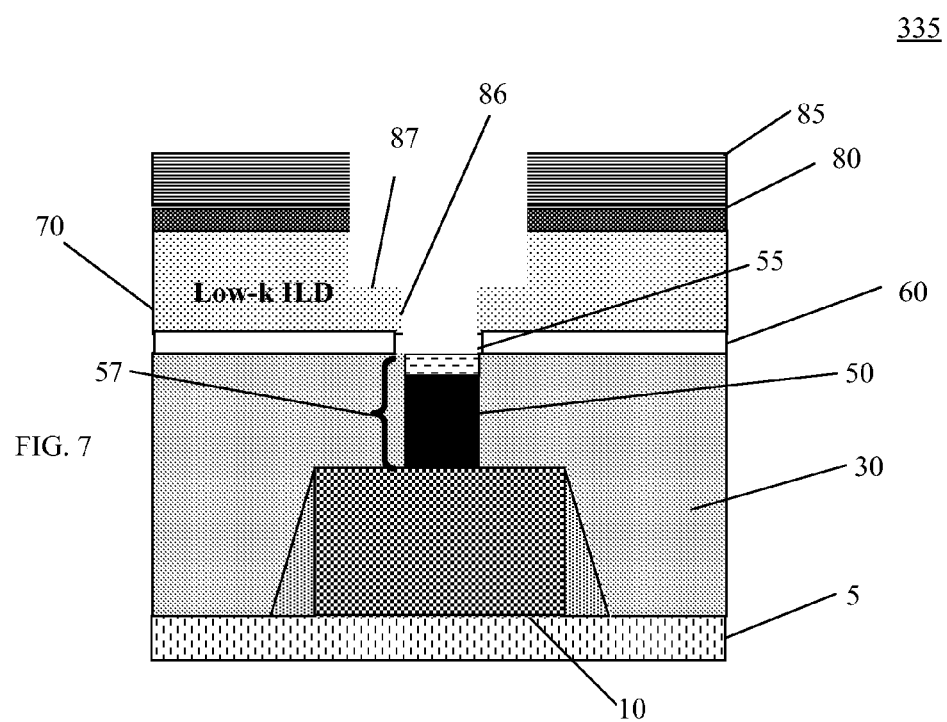

Referring to FIGS. 1, 6 and 7, photoresist 85 may be deposited over HM 80 and patterned to expose an area of HM 80 above (and desirably substantially the same size and shape) as first interconnect portion 57 (P330). The exposed area may be etched to remove the area of HM 80 and etch ILD 70 down to ES 60; desirably the etching process may etch through ES 60 to expose $WN_x$ (i.e., the top of first interconnect part 57) (P335). In one embodiment, a second photoresist pattern may be provided to facilitate the etching of HM 80 and ILD 70 to a selected dept trench for formation of trenches to provide paths that interconnect transistor 10 to other transistors or components on the substrate 5.

In one implementation, HM 80 and ILD 70 are sequentially etched to form a second via 86 down to ES 60, wherein the photoresist 85 provides etch masking ES 60 may be removed with an appropriate etchant to expose the $WN_x$ 55 cap beneath. A second photolithographic process may be used to expose a second area of the HM 80 that is larger than via 50. The exposed portion of HM 80 is etched. ILD 70 may be also etched to a selected depth to provide trenches 87 for later Cu deposition to form, for example, trenched interconnects to other circuit elements.

Figure 8:
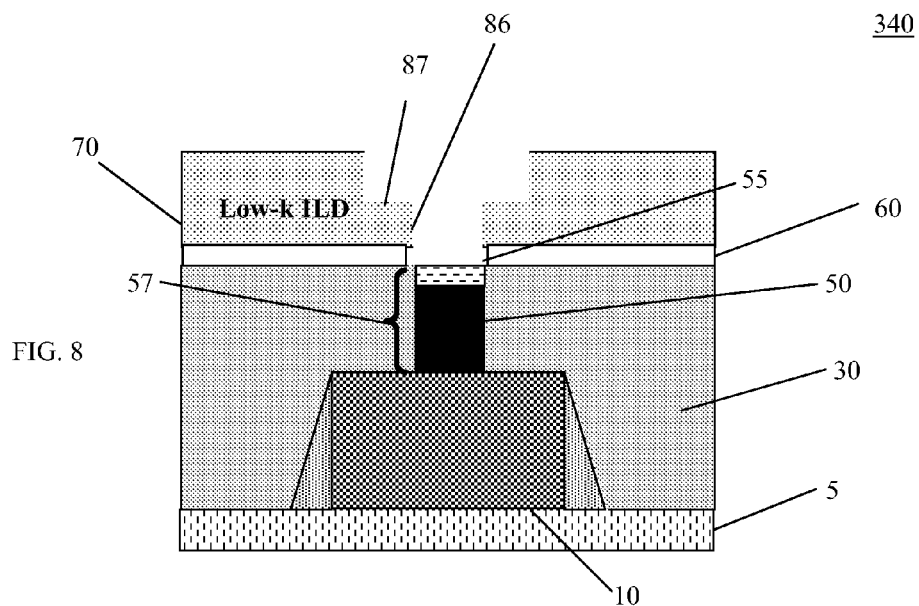
Figure 9:
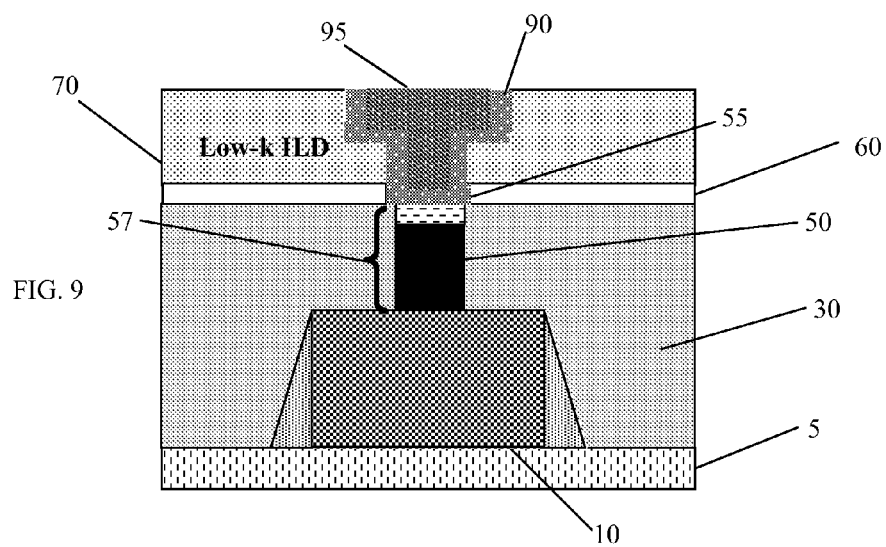

Referring to FIGS. 1, 8 and 9, resist clean and HM removal processes may be performed to prepare via 86 and trench 87 for further processing (P340). A Cu seed layer 90, for example, may be deposited on the substrate 5, coating via 50 (and desirably, any trenches) as a precursor to an electroless (EL) plating of Cu 95 to fill the via 50 (P345, P350). The seed Cu layer may be formed by one or more of plasma vapor deposition (PVD), thermal evaporation, atomic layer deposition (ALD), chemical vapor deposition (CVD), combinations of the above, or an equivalent suitable deposition process.

In some embodiments, the EL Cu plating may create a Cu overburden on the top surface of the substrate 5. Therefore, the Cu may be removed by chemical-mechanical planarization to leave Cu lines embedded level with the top surface of ILD 70, and to interconnect to other circuit elements on the substrate 5 (P355).

In the foregoing, it will be appreciated that the formation of the protective $WN_x$ layer 55, which has good conductivity and adhesion properties, maintains the integrity of the W plug and the contact with Cu. Additionally, TiN as the HM 80 is relatively more transparent at wavelengths used for mask alignment schemes (e.g., registration of HM 80 with circuit features, including first interconnect part 57). Therefore, a HM 80 comprising TiN may more easily facilitate multilevel photolithographic processing where the scaling of feature dimensions down to levels below 100 nm, for example, and device pitch on the order of below 300 nm, for example, benefit from improved registration precision.

The various embodiments described above have been presented by way of example and not by way of limitation. Thus, for example, while embodiments disclosed herein teach the formation of protective nitride cap by plasma deposition, other methods of providing the nitride protective cap are also within the scope of embodiments. Cu deposition may be accomplished by a variety of vacuum or plasma methods, or may additionally employ electroplating techniques.

It should be understood that the processes, methods, and the order in which the respective elements of each method are performed are purely exemplary. Depending on the implementation, they may be performed in a different order or in parallel, unless indicated otherwise in the present disclosure.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multi-chip package (such as a ceramic carrier that has either or both surface interconnections of buried interconnections).

In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An interconnect comprising:
   a semiconductor substrate;
   a first insulator layer formed on the semiconductor substrate, wherein the first insulator layer comprises at least one of $SiO_2$ or a low-k ILD;

a first via formed in the first insulator layer by etching through the first insulator layer to the semiconductor substrate, wherein a first metal (M1) is deposited in the first via;

a $M1\text{-}N_x$ cap selectively formed on the M1 deposit;

an etch-stop layer formed on the first insulator layer to protect the first insulator layer, wherein the etch-stop layer selectively exposes the $M1\text{-}N_x$ cap;

a second insulator layer formed on the etch-stop layer, wherein the second insulator layer comprises at least one of $SiO_2$ or a low-k ILD;

a trench formed in the second insulator layer by etching the second insulator layer to a selected depth;

a second via formed in the second insulator layer by further etching the second insulator layer from the trench to the $M1\text{-}N_x$ cap; and a seed layer coating the trench and the second via, wherein the seed layer comprises a second metal (M2) and makes contact with the $M1\text{-}N_x$ cap, and wherein M2 is deposited in the trench and the second via.

2. The interconnect of claim 1, wherein the value of x is approximately 0.5.

3. The interconnect of claim 1, wherein the etch stop layer comprises at least one of SiN, SiC, SiCN, BN, SiBN or SiBCN.

4. The interconnect of claim 1, wherein the seed layer is formed by at least one of plasma vapor deposition (PVD), thermal evaporation, atomic layer deposition (ALD), and chemical vapor deposition (CVD).

5. The interconnect of claim 1, wherein the second M2 layer is formed by electroless plating.

6. The interconnect of claim 1, wherein M1 comprises tungsten (W) and M2 comprises copper (Cu).

* * * * *